United States Patent
Tanno

(10) Patent No.: US 8,371,498 B2
(45) Date of Patent: *Feb. 12, 2013

(54) METHOD FOR MANUFACTURING A PRINTED WIRING BOARD

(75) Inventor: Katsuhiko Tanno, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/143,429

(22) Filed: Jun. 20, 2008

(65) Prior Publication Data

US 2009/0001139 A1    Jan. 1, 2009

Related U.S. Application Data

(63) Continuation of application No. PCT/JP2006/325406, filed on Dec. 20, 2006.

(30) Foreign Application Priority Data

Dec. 20, 2005 (JP) ................ 2005-366484

(51) Int. Cl.
*B23K 1/20* (2006.01)
*B23K 31/02* (2006.01)

(52) U.S. Cl. ............... 228/203; 228/178; 228/180.22

(58) Field of Classification Search ............... None
See application file for complete search history.

(56) References Cited

U.S. PATENT DOCUMENTS

| | | | |
|---|---|---|---|
| 5,655,704 A * | 8/1997 | Sakemi et al. | 228/246 |
| 6,169,253 B1 * | 1/2001 | Jairazbhoy et al. | 174/250 |
| 6,541,364 B2 * | 4/2003 | Mukuno et al. | 438/612 |
| 7,396,752 B1 * | 7/2008 | Puah | 438/613 |
| 2006/0157540 A1 | 7/2006 | Sumita et al. | |
| 2008/0078810 A1 | 4/2008 | Kawamura et al. | |

FOREIGN PATENT DOCUMENTS

JP        02-238693        9/1990

(Continued)

OTHER PUBLICATIONS

English Translation of JP-02238693: Yamauchi et al. "Solder Supply Method," Sep. 20, 1990.*

(Continued)

*Primary Examiner* — Kevin P Kerns
*Assistant Examiner* — Steven Ha
(74) *Attorney, Agent, or Firm* — Oblon, Spivak, McClelland, Maier & Neustadt, L.L.P.

(57) ABSTRACT

A method for manufacturing a printed wiring board, the method including forming a solder resist layer having a small-diameter aperture and a large-diameter aperture, each aperture exposing a respective joint pad. A metal ball having a first diameter is mounted in the small-diameter aperture by using a mask for small diameter metal balls, which includes a small-diameter aperture area that corresponds to the small-diameter aperture on the solder resist layer. A metal ball having a second diameter larger than the first diameter is mounted in the large-diameter aperture by using a mask for large diameter metal balls, which includes a large-diameter aperture area that corresponds to the large-diameter aperture on the solder resist layer. A small-diameter bump is formed from the metal ball having a first diameter and a large-diameter bump is formed from the metal ball having a second diameter by heating each of the metal ball with a first diameter and the metal ball with a second diameter to at least their respective reflow temperatures.

9 Claims, 15 Drawing Sheets

FOREIGN PATENT DOCUMENTS

| | | |
|---|---|---|
| JP | 04-269834 | 9/1992 |
| JP | 09-057432 | 3/1997 |
| JP | 01-267731 | 9/2001 |
| JP | 2002-151539 | 5/2002 |
| WO | WO 2006/013742 A1 | 2/2006 |

OTHER PUBLICATIONS

U.S. Appl. No. 12/120,046, filed May 13, 2008, Tanno.
U.S. Appl. No. 12/120,076, filed May 13, 2008, Tanno, et al.
U.S. Appl. No. 12/093,436, filed May 12, 2008, Tanno, et al.

* cited by examiner

Fig.14A

| Ball diameter (μm) | N | Bump height (μm) all diameter (μm) | Σ |
|---|---|---|---|
| 60 | 15 | 10.9 | 2.0 |
| 70 | 15 | 23.0 | 1.6 |
| 80 | 15 | 37.8 | 2.0 |
| 90 | 15 | 51.5 | 1.9 |
| 100 | 15 | 61.1 | 1.6 |

Fig.14B

| Ball diameter (μm) | N | Bump height (μm) all diameter (μm) | Σ |
|---|---|---|---|
| 60 | 15 | -5.0 | 1.4 |
| 70 | 15 | 6.2 | 2.0 |
| 80 | 15 | 18.5 | 2.5 |
| 90 | 15 | 31.2 | 1.9 |
| 100 | 15 | 41.9 | 2.3 |

METHOD FOR MANUFACTURING A PRINTED WIRING BOARD

CROSS-REFERENCE TO RELATED APPLICATIONS

The present application is a continuation of PCT/JP2006/325406, filed Dec. 20, 2006, which claims priority to JP 2005-366484 filed Dec. 20, 2005, the entire content of each of these applications is incorporated herein by reference.

TECHNICAL FIELD

The present invention relates to a method for manufacturing a printed wiring board, and more specifically relates to a method for manufacturing a printed wiring board that is preferably used for a package substrate for mounting an IC chip.

DESCRIPTION OF RELATED ART

A solder bump is used for electrically wiring a package substrate and an IC chip. The solder bump is formed through the following processes:
(1) A process to print flux on a joint pad (i.e. pad) formed on the package substrate.
(2) A process to mount a solder ball on the joint pad upon which flux is printed.
(3) A process to form a solder bump from the solder ball by reflowing.
After forming the solder bump on the package substrate, the IC chip is placed on the solder bump, the solder bump and the pad (terminal) of the IC chip are joined together by reflowing, and the IC chip is mounted on the package substrate. In the abovementioned processes to mount a solder ball on a joint pad, a print technology is used, for example by concomitantly using a mask for aligning a ball and a squeegee as shown in Japanese Unexamined Patent Application Publication No. 2001-267731, the entire content of which is incorporated herein by reference.

SUMMARY OF EMBODIMENTS OF THE INVENTION

One aspect of the invention includes a method for manufacturing a printed wiring board, the method including forming a solder resist layer having a small-diameter aperture and a large-diameter aperture, each aperture exposing a respective joint pad. A metal ball having a first diameter is mounted in the small-diameter aperture by using a mask for small diameter metal balls, which includes a small-diameter aperture area that corresponds to the small-diameter aperture on the solder resist layer. A metal ball having a second diameter larger than the first diameter is mounted in the large-diameter aperture by using a mask for large diameter metal balls, which includes a large-diameter aperture area that corresponds to the large-diameter aperture on the solder resist layer. A small-diameter bump is formed from the metal ball having a first diameter and a large-diameter bump is formed from the metal ball having a second diameter by heating each of the metal ball with a first diameter and the metal ball with a second diameter to at least their respective reflow temperatures.

Another aspect of the invention includes a method for manufacturing a printed wiring board, the method including forming a solder resist layer having a small-diameter aperture and a large-diameter aperture, each aperture exposing a respective joint pad. A metal ball having a first diameter is mounted in the small-diameter aperture by using a mask for small diameter metal balls, which includes a small-diameter aperture area that corresponds to the small-diameter aperture on the solder resist layer, and a small-diameter bump is formed by heating the metal ball having a first diameter to at least a reflow temperature for the metal ball having a first diameter. A metal ball having a second diameter larger than the first diameter is mounted in the large-diameter aperture by using a mask for large diameter metal balls, which includes a large-diameter aperture area that corresponds to the a large-diameter aperture on the solder resist layer, and a large-diameter bump is formed by heating the metal ball having a second diameter to at least a reflow temperature for the metal ball having the second diameter.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings wherein:

FIG. 13.

FIG. 14: FIG. 14(A) is a table showing the correspondence between the diameter of a solder ball and the height of a solder bump corresponding to an aperture diameter of 80 μm, and FIG. 14(B) is a table showing the correspondence between the diameter of a solder ball and the height of a solder bump corresponding to an aperture diameter of 105 μm.

DETAILED DESCRIPTION

Figure 1A:
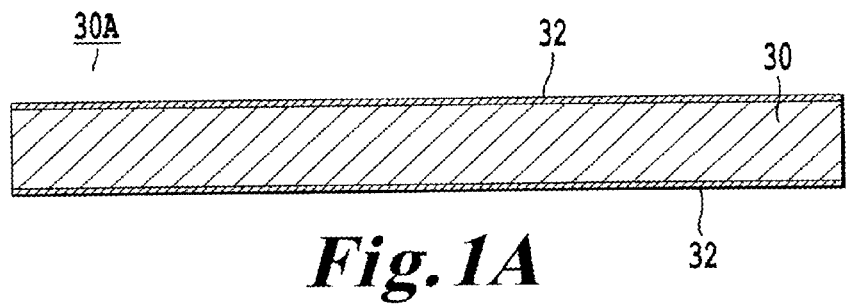
FIG. 1A flowchart showing a method for manufacturing a multilayered printed wiring board as in Embodiment 1 in the present invention.
Figure 1B:
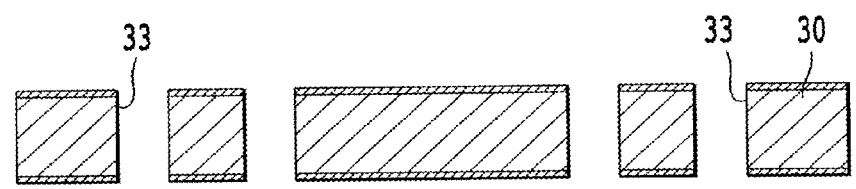
Figure 1C:
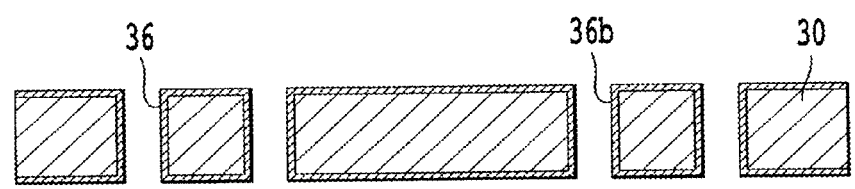

Because a small-diameter solder ball may be smaller than a sand grain, in the conventional method for concomitantly using a mask for aligning a ball and a squeegee, the solder ball is deformed by the squeegee and the height of the solder bump varies, resulting in quality deterioration. In other words, when a solder ball becomes smaller, the ratio of the weight to the surface area decreases and an adsorptive phenomenon occurs to the solder ball due to the intermolecular force. In the prior art, because a solder ball that aggregates easily comes in contact with a squeegee, the solder ball is damaged and partially defected. If the solder ball is partially defected, the volume of the solder bump becomes different on each joint pad and the height of the solder bump varies as mentioned above.

One of the objectives of the present invention is to provide a method for manufacturing a printed wiring board to form bumps of approximately the same height on joint pads with differing aperture diameters of solder resists (a conductor circuit in which sizes exposed from a solder resist layer each differ).

In order to achieve the abovementioned objective, a method for manufacturing a printed wiring board with a bump in can include at least the following (a) to (d) steps:
(a) a process to form a solder resist layer having a small-diameter aperture and a large-diameter aperture each to expose a joint pad;
(b) a process to mount a low-melting metal ball with a small diameter on the small-diameter aperture by using a mask for the small diameter, the mask including a small-diameter aperture area that corresponds to the small-diameter aperture on the abovementioned solder resist layer;
(c) a process to mount a low-melting metal ball with a large diameter on the large-diameter aperture by using a mask for the large diameter comprising a large-diameter aperture area that corresponds to the large-diameter aperture on the abovementioned solder resist layer;
(d) a process to form a small-diameter bump from the abovementioned low-melting metal ball with a small diameter, and a large-diameter bump from the abovementioned low-melting metal ball with a large diameter through reflowing.

Additionally, a method for manufacturing a printed wiring board with a bump includes at least the following steps (a) to (e):
(a) a process to form a solder resist layer having a small-diameter aperture and a large-diameter aperture so as to expose a joint pad;
(b) a process to mount a low-melting metal ball with a small diameter on the small-diameter aperture by using a mask for the small diameter, the mask including a small-diameter aperture area that corresponds to the small-diameter aperture on the abovementioned solder resist layer;
(c) a process to form a small-diameter bump from the abovementioned low-melting metal ball with a small diameter through reflowing;
(d) a process to mount a low-melting metal ball with a large diameter on the large-diameter aperture by using a mask for large diameters, the mask including the mask including a large-diameter aperture area that corresponds to the large-diameter aperture on the abovementioned solder resist layer;
(e) a process to form a large-diameter bump from the abovementioned low-melting metal ball with a large diameter through reflowing.

In one aspect of the invention, a low-melting metal ball with a small diameter is mounted in a small-diameter aperture on the solder resist layer by using a mask for small diameters. Then, a low-melting metal ball with a large diameter is mounted in a large-diameter aperture on the solder resist layer by using a mask for large diameters. Subsequently, because reflowing causes a small-diameter bump to be formed from the low-melting metal ball with a small diameter mounted in the small-diameter aperture on the solder resist layer, while a large-diameter bump is formed from the low-melting metal ball with a large diameter mounted in the large-diameter aperture on the solder resist layer, a small-diameter bump and a large-diameter bump differing in diameter can be formed at approximately the same height. Consequently, when jointing a joint pad of the printed wiring board and an IC chip through a small-diameter bump and a large-diameter bump, joint reliability between an IC chip and printed wiring board can be secured. Additionally, simultaneous reflowing of the low-melting metal ball with a small diameter and the low-melting metal ball with a large diameter can reduce the number of reflow items and lower the possibility of degraded reliability of the printed wiring board caused by thermal history.

In another aspect of the invention, a mask for large diameters comprises a small-diameter aperture area corresponding to a small-diameter aperture on the solder resist layer. Consequently, when adjusting the position of a mask for large diameters, interference between the low-melting metal ball with a small diameter that is already mounted in the small-diameter aperture on the solder resist layer and the mask for large diameters can be avoided in said small-diameter aperture area. In such manner, the mask for large diameters can be positioned proximally to the solder resist layer and the low-melting metal ball with a large diameter that can be appropriately mounted in the large-diameter aperture, resulting in avoiding mispositioning or missing small-diameter or large-diameter bumps.

In still another aspect of the invention, a low-melting metal ball with a small diameter is mounted in a small-diameter aperture on the solder resist layer by using a mask for small diameters. Then, after forming a small-diameter bump from the low-melting metal ball with a small diameter by reflowing, a low-melting metal ball with a large diameter is mounted in a large-diameter aperture on the solder resist layer by using a mask for large diameters. Then, a large-diameter bump is formed from a low-melting metal ball with a large diameter by reflowing. Therefore, because a small-diameter bump is formed from a low-melting metal ball with a small diameter mounted in the small-diameter aperture on the solder resist layer and a large-diameter bump is formed from a low-melting metal ball with a large diameter mounted in the large-diameter aperture on the solder resist layer, the small-diameter bump and large-diameter bump that are different in diameter can be formed at approximately the same height. Consequently, when jointing a joint pad of the printed wiring board and an electrode of the IC chip through a small-diameter bump and a large-diameter bump, joint reliability between the IC chip and the printed wiring board can be secured. Additionally, after melting the low-melting metal ball with a small diameter through reflowing, a mask for the large diameter is used. Once the low-melting metal is melted, it is not likely to be mispositioned even if it comes into contact with a large-diameter mask. Therefore, the large-diameter mask can be positioned proximally to the solder resist layer and the low-melting metal ball with a large diameter can be appropriately mounted in the large-diameter aperture, resulting in avoiding mispositioning or missing small-diameter or large-diameter bumps.

Another aspect of the invention includes a cylindrical member being positioned on the upper side of a mask for small diameters, a low-melting metal ball with a small diameter is aggregated by intaking air from an aperture area of said cylindrical member, the aggregated low-melting metal ball with a small diameter is moved by moving the cylindrical member horizontally, and the low-melting metal ball with a small diameter is dropped into the small-diameter aperture on the solder resist layer through the small-diameter aperture area of the mask for the small diameter. Consequently, a fine low-melting metal ball with small diameter can be securely mounted in all the diameter apertures on the solder resist layer. Additionally, because the low-melting metal ball with a small diameter is moved essentially without contacting a moving tool, unlike in cases involving the use of a squeegee, it can be mounted in the small-diameter aperture with minimum damaging of the low-melting metal ball with a small diameter, and the height of the bumps can be made more uniform. Furthermore, even on an undulated printed wiring board such as a build-up multilayered wiring board, a low-melting metal ball with a small diameter can be placed appropriately into a small-diameter aperture.

In still another aspect, a cylindrical member is positioned on the upper side of the mask for large diameters, a low-melting metal ball with a large diameter is aggregated by intaking air from the aperture area of said cylindrical member, the aggregated low-melting metal ball with a large diameter is moved by moving the cylindrical member horizontally, and the low-melting metal ball with a large diameter is dropped into a large-diameter aperture on the solder resist layer through the large-diameter aperture area of the mask for large diameters. Consequently, a fine low-melting metal ball with a large diameter can be securely mounted in all the large-diameter apertures on the solder resist layer. Additionally, because the low-melting metal ball with a large diameter is moved essentially without contacting a moving tool, unlike in cases involving the use of a squeegee, it can be mounted in the large-diameter aperture without damaging the low-melting metal ball with a large diameter and the height of the bumps can be made more uniform. Furthermore, even on an undulated printed wiring board such as a build-up multilayered wiring board, a low-melting metal ball with a large diameter can be placed appropriately into a large-diameter aperture.

[Embodiment 1]

Figure 13A:
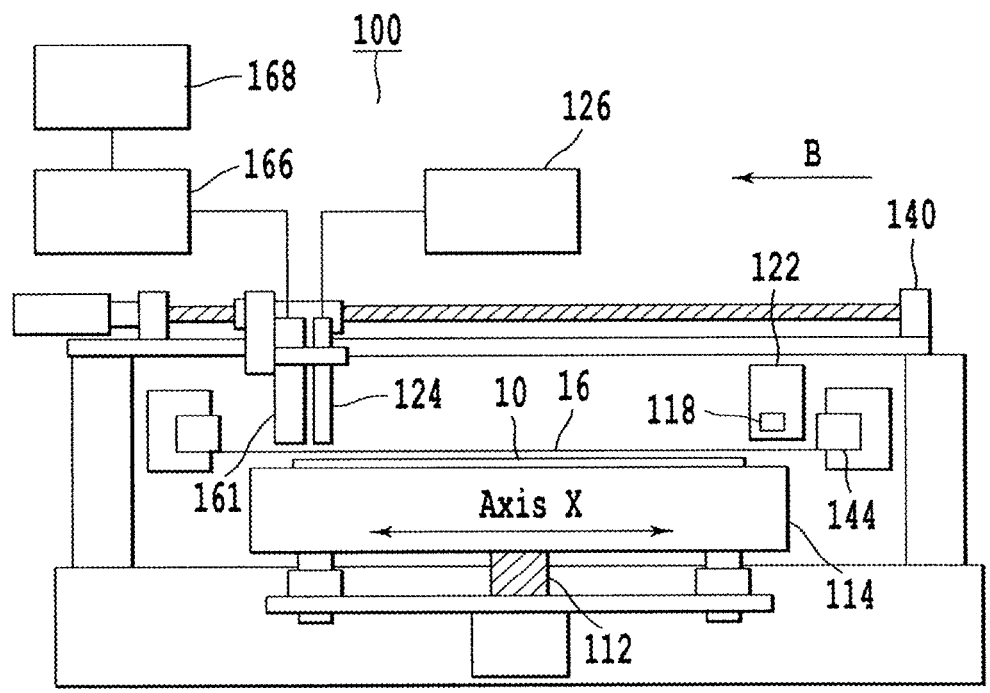
FIG. 13(A) shows the framework of a device for mounting a solder ball related to the Embodiments of the present invention.
Figure 13B:
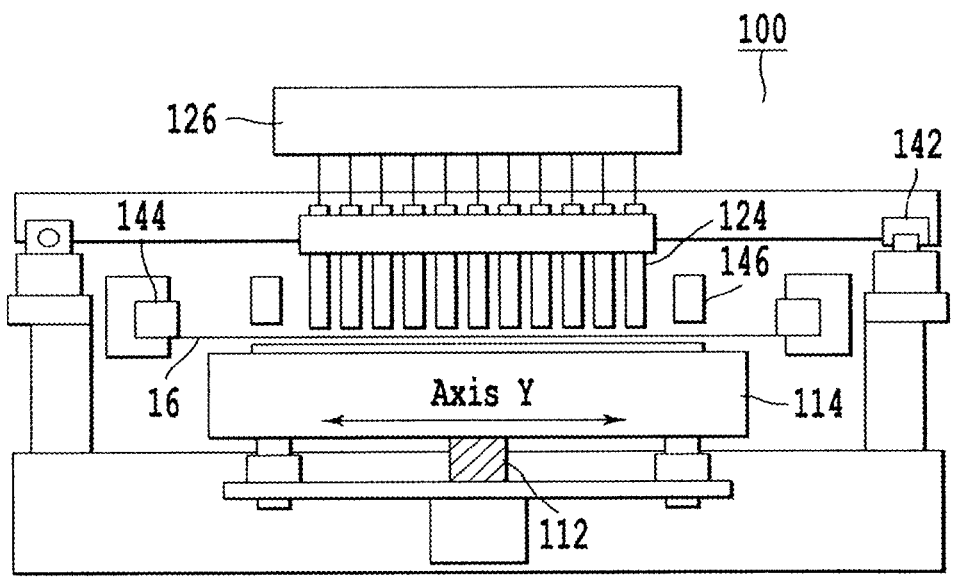
FIG. 13(B) shows the view from arrow B of the device for mounting a solder ball in FIG. 13(A).

With reference to FIG. 13, a device for mounting a solder ball to mount a small solder ball 77M (less than 200 μm in diameter) on a joint pad of the multilayered printed wiring board is explained. FIG. 13(A) shows the framework of a device for mounting a solder ball related to one example of the embodiments in the present invention, and FIG. 13(B) shows the view from arrow B of the device for mounting a solder ball in FIG. 13(A).

A device for mounting a solder ball 100 comprises: a XYθ suction table 114 that holds the positioning of a multilayered printed wiring board 10; a vertically moving axis 112 that moves said XYθ suction table 114 up and down; a mask for aligning a ball 16 comprising an aperture that corresponds to a joint pad of the multilayered printed wiring board and a mount cylinder (cylindrical member) 124 that guides a solder ball moving on a mask for aligning a ball 16. Also included is a suction box 126 that provides negative pressure on the mount cylinder 124; a cylinder for removing absorbed balls 161 to collect redundant solder balls; a suction box 166 that provides negative pressure on said cylinder for removing absorbed balls 161 and a suction device for removing absorbed balls 168, which holds the collected solder balls. Further included is a mask clamp 144 that clamps the mask for aligning a ball 16; a moving axis in the X direction 140 that sends the mount cylinder 124 and the cylinder for removing absorbed balls 161 in an X direction; a support guide for the moving axis 142 that supports the moving axis in an X direction 140 and an alignment camera 146 that images a multilayered printed wiring board 10. Also included is a sensor for detecting remaining quantity 118 that detects the remaining quantity of solder balls under the mount cylinder 124; and a feeding device for solder balls 122 that feeds solder balls to the mount cylinder 124 according to the remaining quantity detected by the sensor for detecting remaining quantity 118.

Figure 8A:
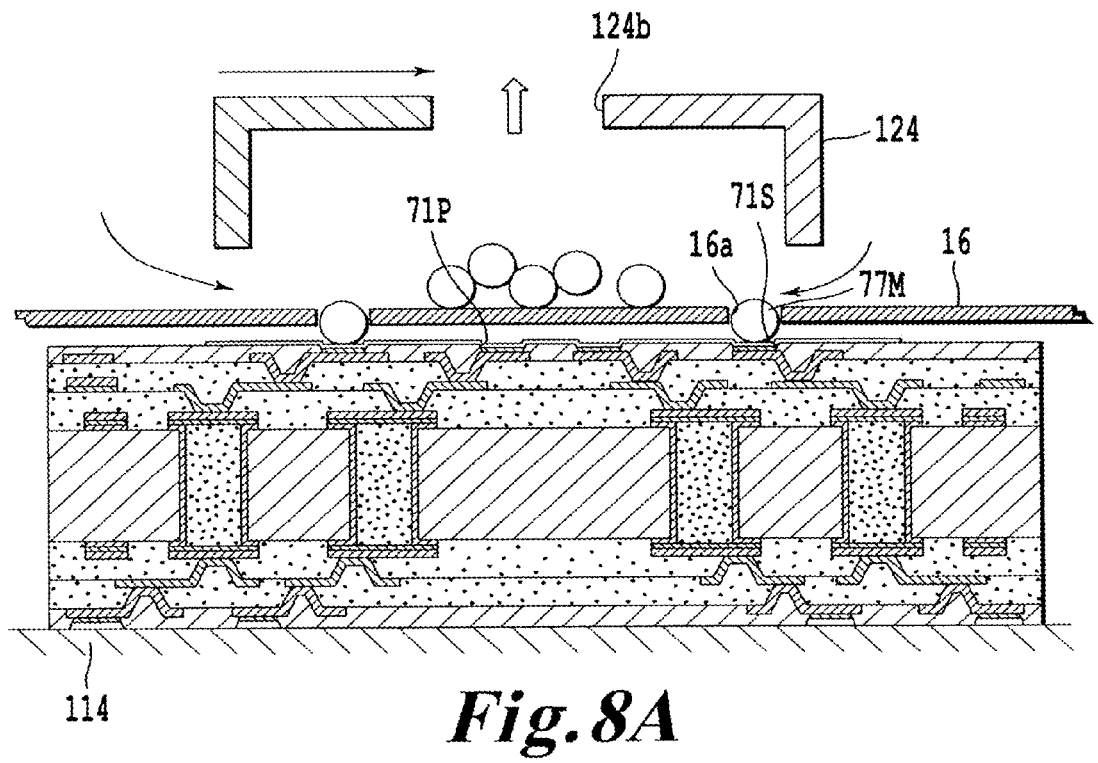
FIG. 8 is a flowchart showing a method for manufacturing a multilayered printed wiring board as in Embodiment 1.
Figure 8B:
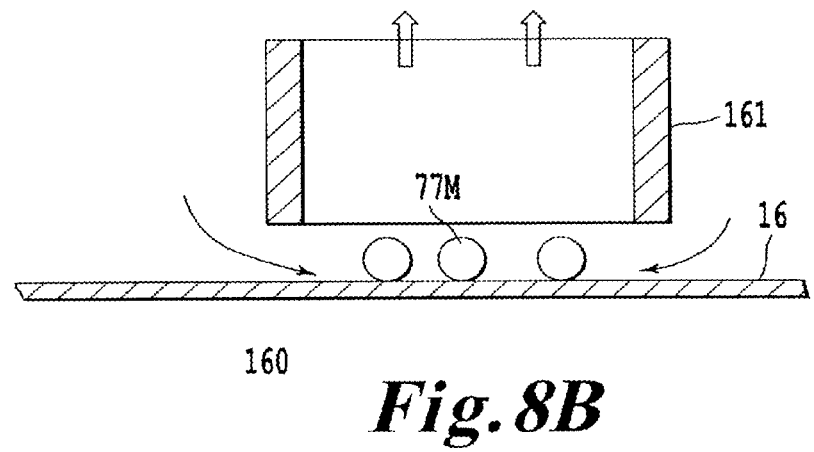
Figure 9A:
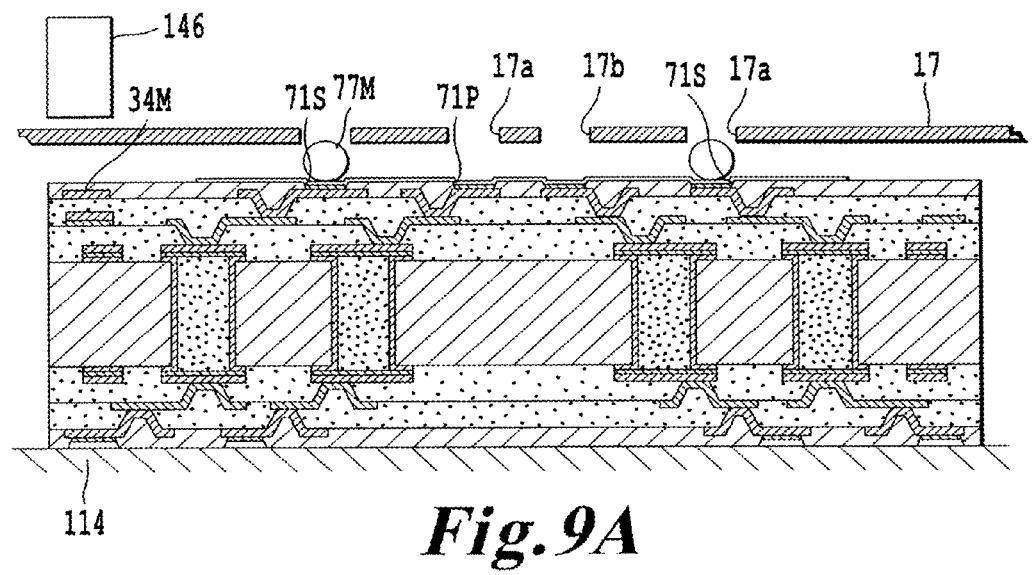
FIG. 9 is a flowchart showing a method for manufacturing a multilayered printed wiring board as in Embodiment 1.
Figure 9B:
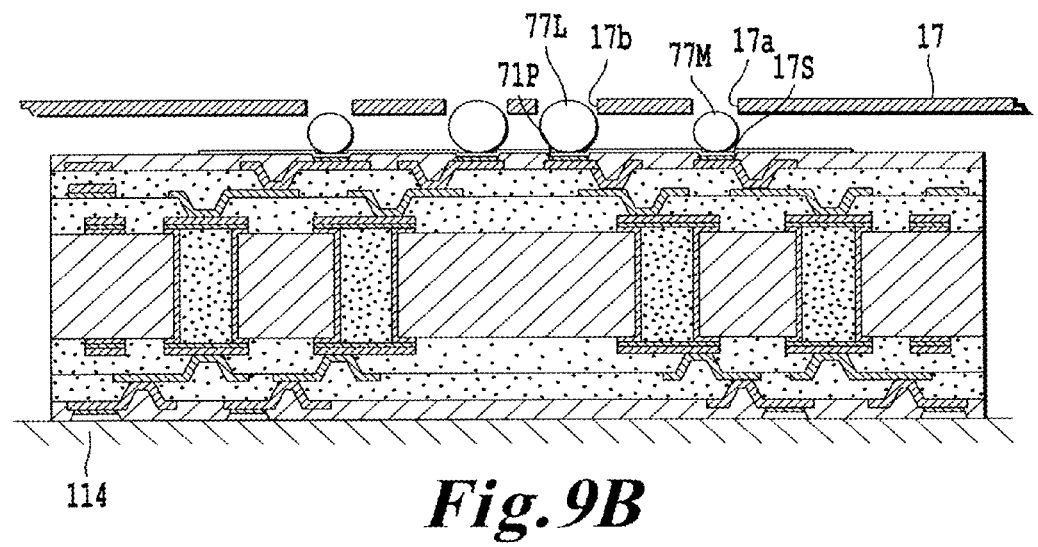
Figure 10:
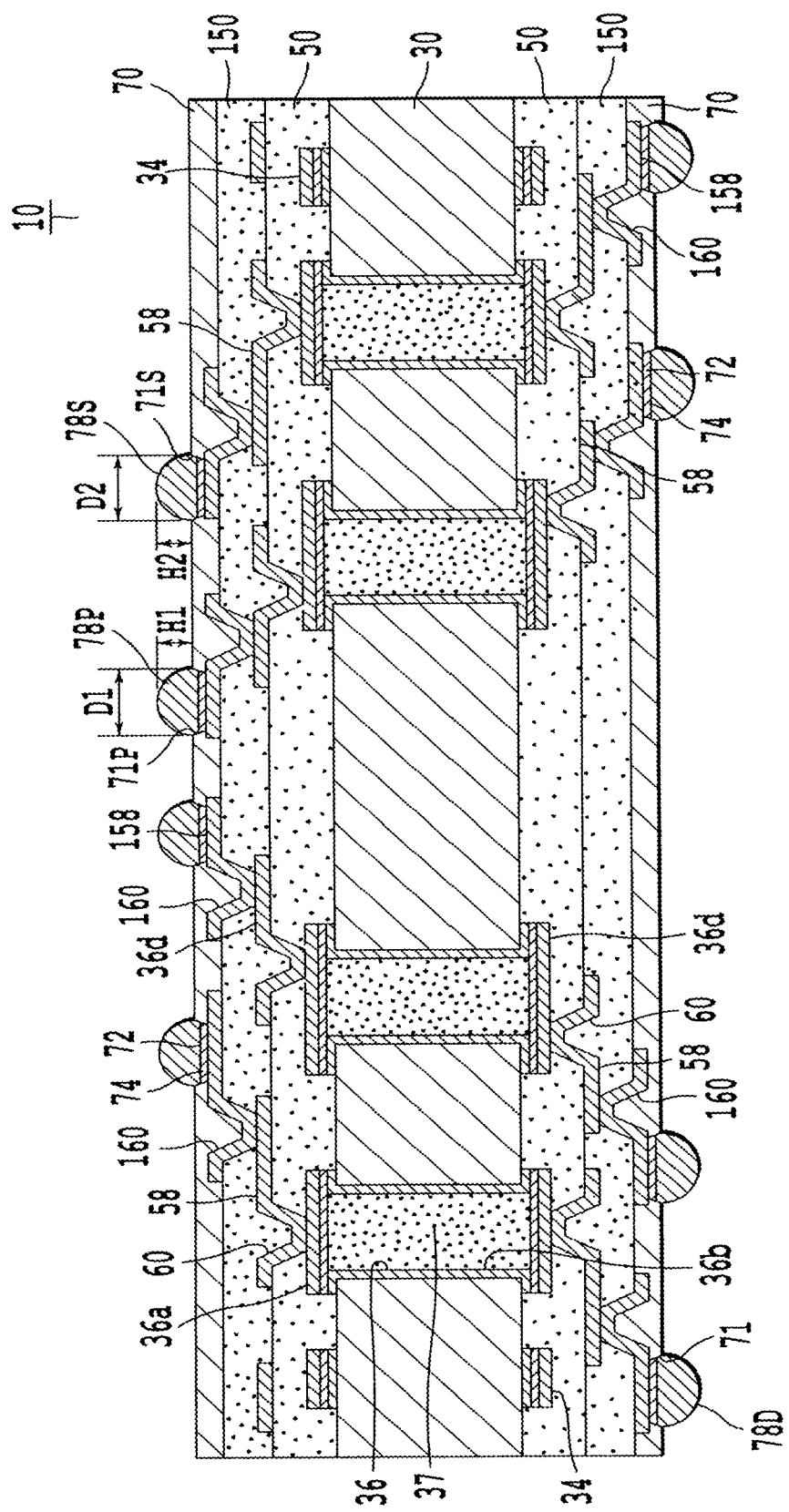
FIG. 10 is a cross-sectional view of a multilayered printed wiring board related to Embodiment 1.
Figure 11:
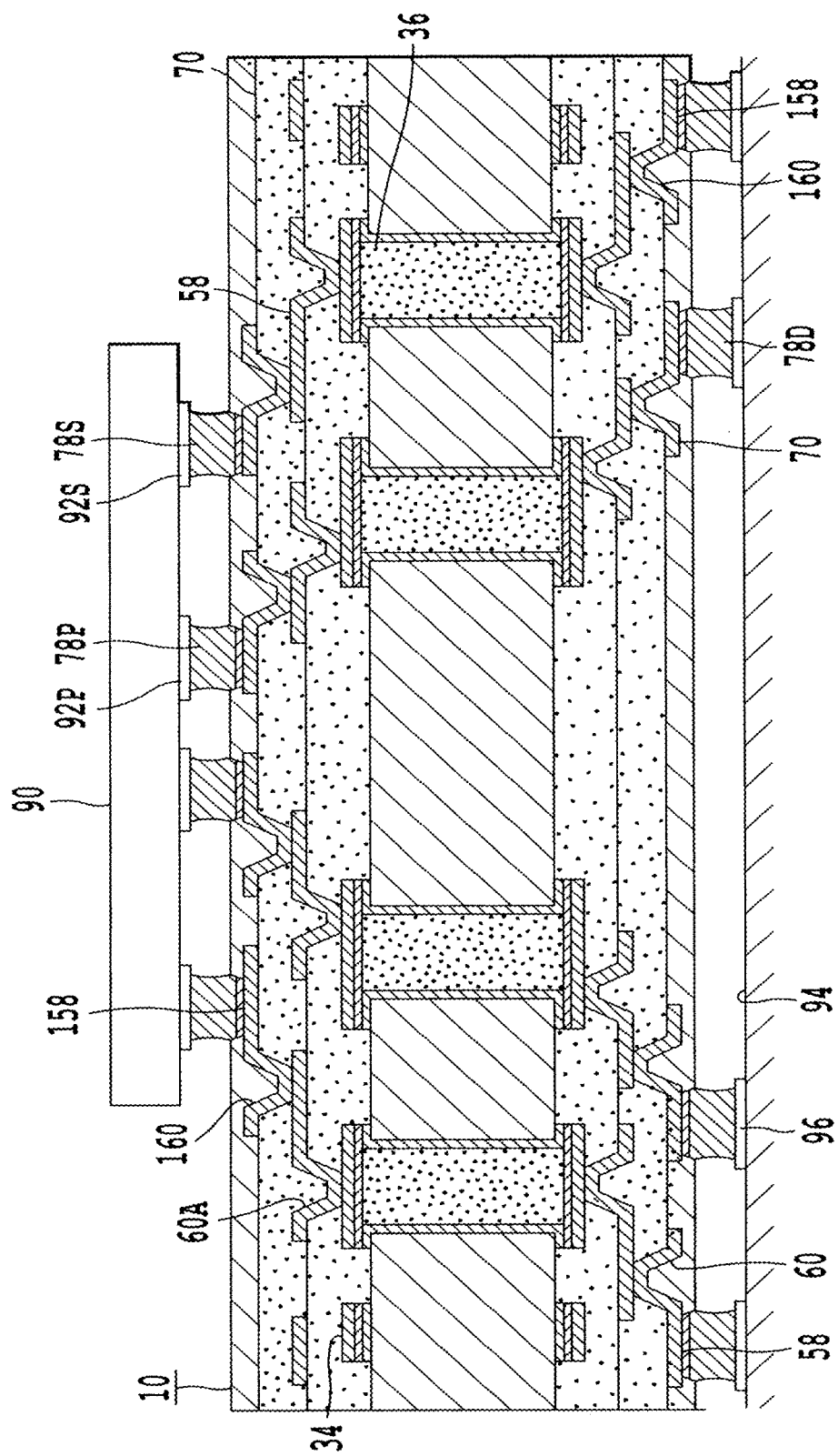
FIG. 11 is a cross-sectional view of a state in which an IC chip is placed on the multilayered printed wiring board in FIG. 10.

Next, with reference to FIG. 1 to FIG. 11, the constitution of the multilayered printed wiring board 10 related to Embodiment 1 of the present invention is explained. FIG. 10 shows a cross-sectional view of said multilayered printed wiring board 10 and FIG. 11 shows the board in a state in which an IC chip 90 is mounted on the multilayered printed wiring board 10 in FIG. 10 and placed on a daughter board 94. As shown in FIG. 10, on the multilayered printed wiring board 10, a conductor circuit 34 is formed on the surface of a core substrate 30. The front and back surfaces of the core substrate 30 are jointed through a through-hole 36. On the core substrate 30, an interlayer resin insulation layer 50 upon which a via-hole 60 and a conductor circuit 58 are formed, and an interlayer resin insulation layer 150 on which a via-hole 160 and a conductor circuit 158 are formed are aligned. On the upper layer of said via-hole 160 and conductor circuit 158, a solder resist layer 70 is formed. A large-diameter (D1=105 μm) aperture 71P and a small-diameter (D2=80 μm) aperture 71S are formed on the solder resist layer 70, a large-diameter solder bump 78P for power or earth is aligned on the large-diameter aperture 71P, and a small-diameter solder bump 78S for signals is mounted in the small-diameter aperture 71S. The height H1 of the large-diameter solder bump 78P is set to approximately 30 μm and the height H2 of the small-diameter solder bump 78S is also set to approximately 30 μm. The large-diameter solder bumps 78P for power and earth are aligned near the center of the multilayered printed wiring board so as to shorten the wiring distance, while the small-diameter solder bumps 78S for signals are aligned relatively apart from the center. On the underside of the multilayered printed wiring board, a solder bump 78D is formed through the aperture 71 of said solder resist layer 70. In addition, in FIG. 10, although an aperture of the solder resist is formed so as to expose a part of the conductor circuit 158, an aperture may be formed so as to include only a via-hole 160 or a via-hole 160 and a part of the conductor circuit 158.

With the high integration of IC, solder bumps for signal lines on package substrates are required to become even smaller in diameter and narrower in pitch. On the contrary, in order to support instantaneous increases of consumption power of an IC chip, a solder bump for a power line or earth line on a package substrate is desired not to become extremely small in diameter. In other words, because the resistance value of solder bumps made of solder alloy increases with smaller diameters, voltage drops when consumption power increases instantaneously, which can cause malfunction of the IC chip. As a corresponding method for such contradicting requirements, it is desirable to use a solder bump with two types of diameters in which a solder bump for signal lines is made smaller in diameter and a solder bump for power and earth is not made smaller in diameter.

As shown in FIG. 11, a large-diameter solder bump 78P for power and earth on the upper side of the multilayered printed wiring board 10 is jointed to an electrode 92P for power and earth of an IC chip 90, and a small-diameter solder bump 78S for signals is joined to an electrode 92S for signals. On the other hand, a solder bump 78D on the lower side is jointed to a land 96 of a daughter board 94.

Continuously, with reference to FIG. 1 to FIG. 6, a method for manufacturing the abovementioned multilayered printed wiring board 10 discussed above with reference to FIG. 10 is explained.

(1) On both sides of an insulating substrate 30 that is made of glass epoxy resin or BT (bismaleimide triazine) resin with thicknesses ranging from 0.2 to 0.8 mm, a copper-clad lamination 30A on which 5 to 250 μm of copper foil 32 is laminated is made as the starting material (FIG. 1(A)). Firstly, this copper-clad lamination is drilled to make a hole 33 (FIG. 1(B)), and a lateral conductor layer 36b of a through-hole 36 is formed through nonelectrolytic plating and electrolytic plating (FIG. 1(C)).

Figure 1D:
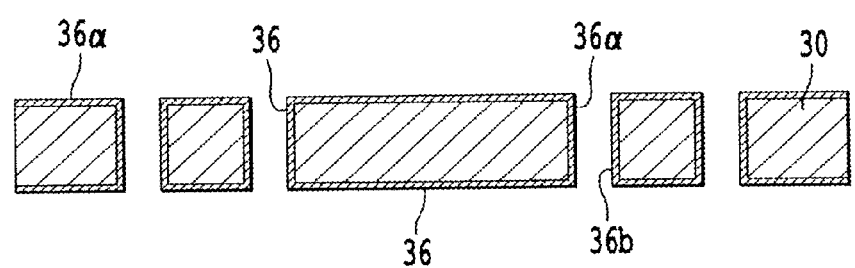

(2) After washing and drying the substrate 30 on which the through-hole 36 is formed, blackening treatment is performed using a blackening bath (oxidizing bath) of aqueous solution containing NaOH (log/1), $NaClO_2$(40 g/l), and $Na_3PO_4$ (6 g/l), reduction treatment is performed with a reduction bath of aqueous solution containing NaOH (10 g/l) and $NaBH_4$ (6 g/l), and a rough surface 36α is formed on the lateral conductor layer 36b and the surface of the through-hole 36 (FIG. 1(D)).

(3) Next, filler 37 (e.g., nonconductive dilling copper paste manufactured by Tatsuta Electric Wire & Cable Co., Ltd., product name: DD PASTE) containing copper particles with an average particle diameter of 10 μm is filled into a through-hole 36 by screen printing before being dried and hardened (FIG. 2(A)). This is filled into a through-hole by applying in a printing method on the substrate upon which a mask equipped with an aperture on the through-hole area is placed, and afterwards it is dried and hardened.

Figure 2A:
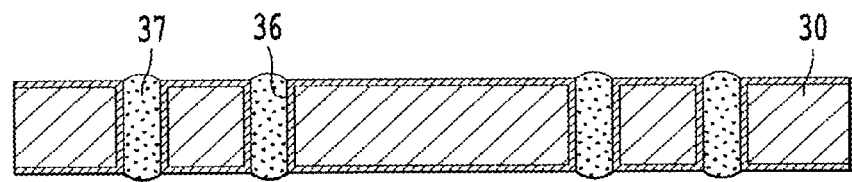
FIG. 2 is a flowchart showing a method for manufacturing a multilayered printed wiring board as in Embodiment 1.
Figure 2B:
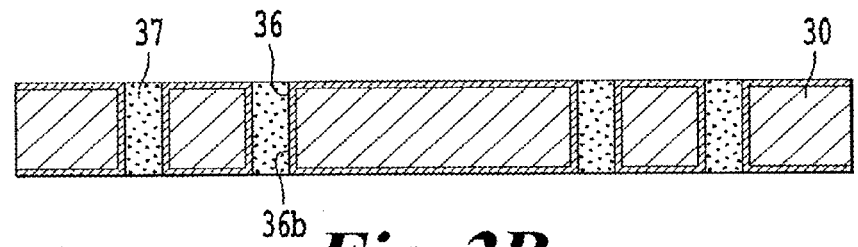

The filler 37 protruding from the through-hole 36 is removed by a belt sander with #600 belt abrasive paper (e.g., manufactured by Sankyo Rikagaku Co., Ltd.), and further abrased with a puff to scratches caused by this belt sander abrasive to make the surface of the substrate 30 flat (see FIG. 2(B)). In this manner, a substrate 30 in which the lateral conductor layer 36b and the resin filler 37 of the through-hole 36 are closely attached through the rough layer 36α is obtained.

Figure 2C:
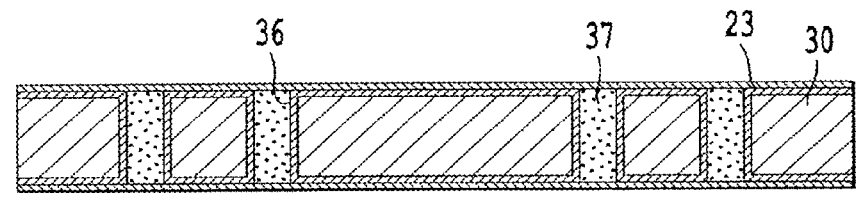

(4) On the surface of the substrate 30 that was made flat in the abovementioned (3), a palladium catalyst (manufactured by Atotech Japan) is provided and treated with electroless copper plating to form an electroless copper plating film 23 with a thickness of 0.6 μm (see FIG. 2(C)).

Figure 2D:
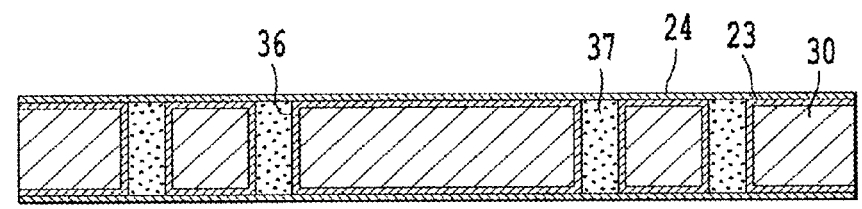

(5) Subsequently, by performing electro-copper plating under the following conditions and forming an electrol copper plating film 24 with a thickness of 15 μm, an area to be a lid-plated layer (through-hole land) to thicken the area to be a conductor circuit 34 and cover the filler 37 that is filled in the through-hole 36 is formed (FIG. 2(D)). The aqueous solution for electrolytic plating includes:

| | |
|---|---|
| Sulphuric acid | 180 g/l, |
| Copper sulfate | 80 g/l, and |
| Additive | (manufactured by Atotech Japan, product name: Cupracid GL (1 ml/l)). |

The Conditions for electrolytic plating are

| | |
|---|---|
| Current density | 1 $A/dm^2$, |
| Time | 70 minutes, and |
| Temperature | Room temperature. |

Figure 2E:
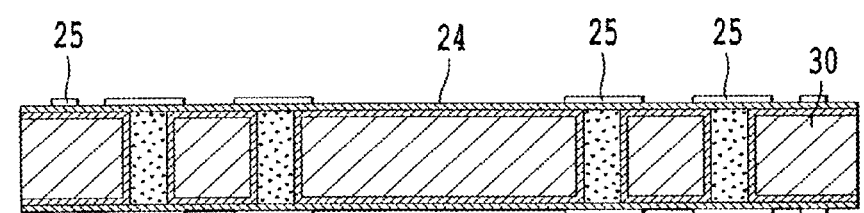

(6) On both sides of the substrate 30 to be a conductor circuit and a lid-plated layer, commercially available photosensitive dry film is attached, a mask is placed, and an etching resist 25 with a thickness of 15 μm is formed by exposing at 100 $mJ/cm^2$ and processed to develop with 0.8% sodium carbonate (see FIG. 2(E)).

(7) Then, plated film 23, 24 and a copper foil 32, on which the etching resist 25 is not formed, is dissolved to remove with etching solution that is composed mostly of cupric chloride. Then, the independent conductor circuit 34 and the lid-plated layer 36a to cover the filler 37 are formed by delaminating to remove the etching resist 25 with 5% KOH (see FIG. 3(A)).

Figure 3A:
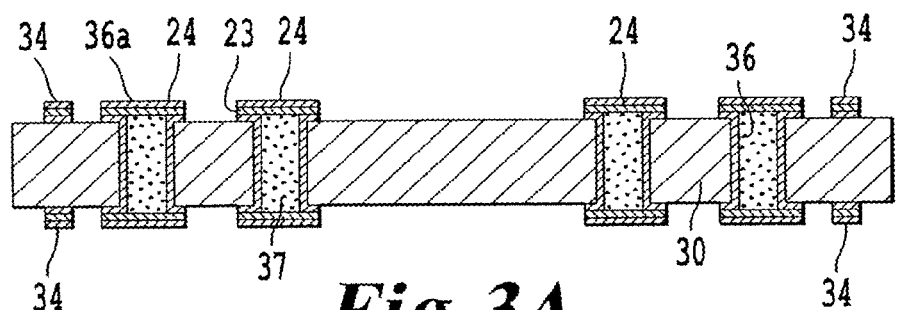
FIG. 3 is a flowchart showing a method for manufacturing a multilayered printed wiring board as in Embodiment 1.
Figure 3B:
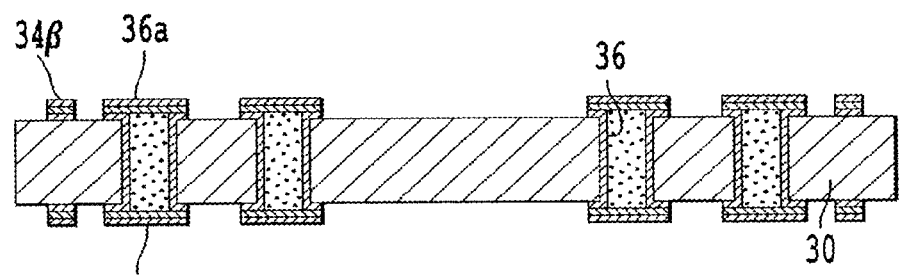
Figure 3C:
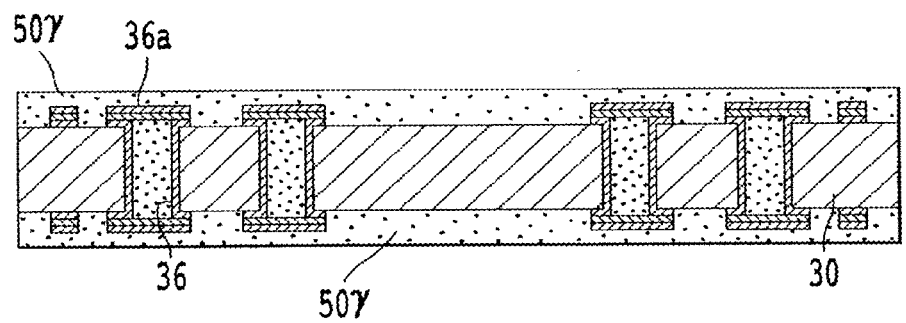

(8) Next, on the surface of the conductor circuit 34 and the lid-plated layer 36a to cover the filler 37, a rough layer (concavo-convex layer) 34β with a thickness of 2.5 μm made of a Cu—Ni—P alloy is formed, and on the surface of this rough layer 34β, an Sn layer with a thickness of 0.3 μm is formed (see FIG. 3(B), provided, however, that an Sn layer is not shown).

(9) On both sides of the substrate, a resin film for an interlayer resin insulation layer (e.g., manufactured by Ajinomoto Co., Inc.: product name: ABF-45SH) 50γ that is slightly larger than the substrate is placed on the substrate and cut by temporarily bonding with pressure under 0.45 Mpa of pressure at 80° C. for 10 seconds, and is further attached with a vacuum laminator device in the following method to form an interlayer resin insulation layer 50 (FIG. 3(C)).

In other words, the resin film for the interlayer resin insulation layer is actually bonded with pressure on the substrate under a vacuum degree of 67 Pa and 0.47 Mpa of pressure at 85° C. for 60 seconds and subsequently hardened with heat at 170° C. for 40 minutes.

Figure 3D:
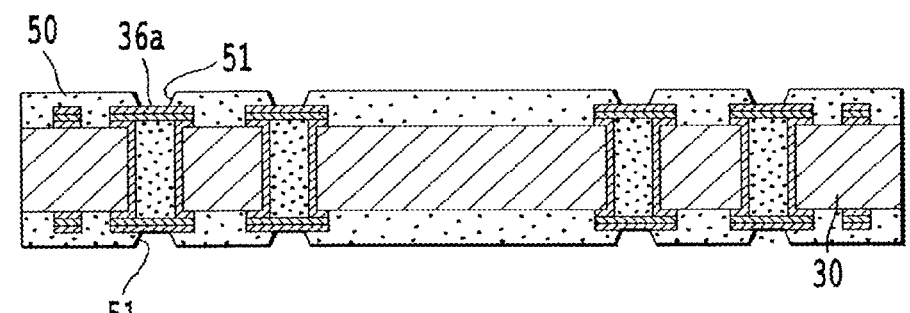

(10) Next, with a CO2 gas laser with a wavelength of 10.4 μm, an aperture 51 for a via-hole is formed on an interlayer resin insulation layer 50 (FIG. 3(D)) under the following conditions: beam diameter of 4.0 mm, top hat mode, pulse width of 3 to 30μ seconds, diameter of through-hole on the mask of 1.0 to 5.0 mm, and with 1 to 3 shots.

Figure 4A:
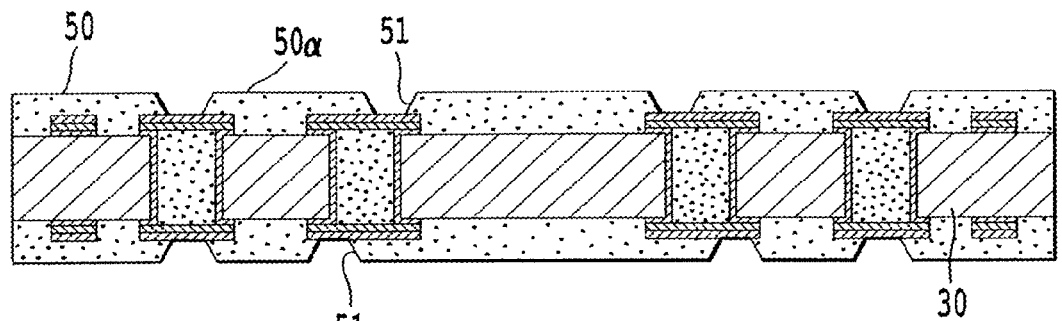
FIG. 4 is a flowchart showing a method for manufacturing a multilayered printed wiring board as in Embodiment 1.

(11) The substrate on which the aperture 51 for the via-hole is formed is soaked into solution containing 60 g/l permanganic acid at 80° C. for 10 minutes, and a rough surface 50α is formed on the surface of the interlayer resin insulation layer 50 including the inner wall of the aperture 51 for the via-hole by removing particles on the surface of the interlayer resin insulation layer 50 (FIG. 4(A)).

(12) Next, the substrate on which the abovementioned treatment is completed is washed with water after soaking into neutralization solution (e.g., manufactured by Shipley Company L.L.C). Furthermore, by providing a palladium catalyst on the surface of said substrate on which roughening treatment (roughening depth 3 μm) is performed, the nucleus of the catalyst is attached on the surface of the interlayer resin insulation layer and the inner wall of the aperture for the via-hole. In other words, the abovementioned substrate is soaked into a catalyst solution containing palladium chloride ($PbCl_2$) and stannous chloride ($SnCl_2$) and the catalyst is provided by precipitating palladium metal.

Figure 4B:
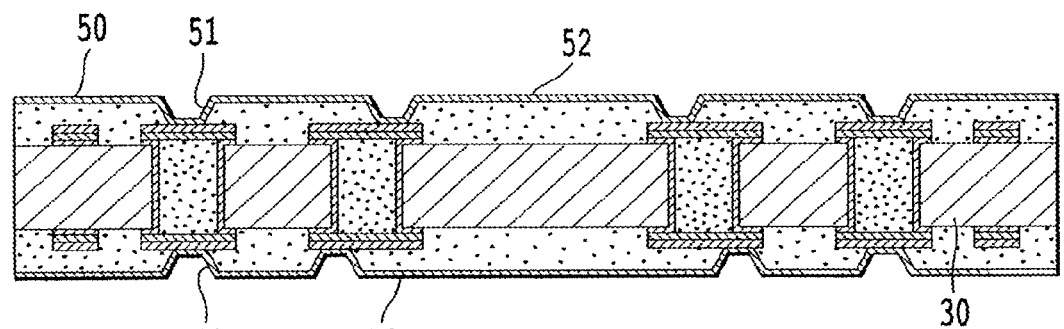
Figure 4C:
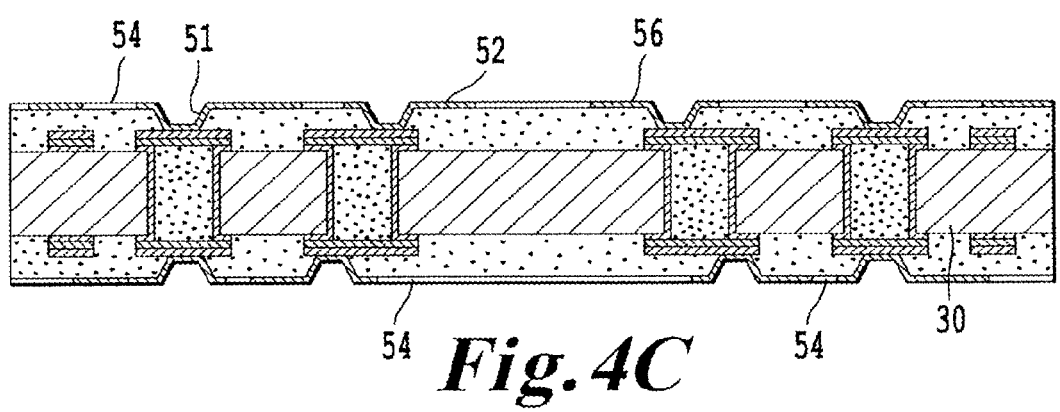

(13) Next, the substrate provided with the catalyst is soaked into an aqueous solution for electroless copper plating (THRU-CUP PEA) manufactured by Uyemura & Co., Ltd., an electroless copper plating film with a thickness of 0.3 to 3.0 μm is formed throughout the rough surface, and a substrate on which the electroless copper plating film 52 is formed on the surface of the interlayer resin insulation layer 50 including the inner wall of aperture 51 for the via-hole is obtained (FIG. 4(B)). The conditions for nonelectrolytic plating are: at 34° C. solution temperature for 45 minutes.

(14) On the substrate on which an electroless copper plating film 52 is formed, a commercially available photosensitive dry film is attached, a mask is placed, and a plated resist 54 with a thickness of 25 μm is mounted by exposing at 110 $mJ/cm^2$ and treating to develop in a 0.8% sodium carbonateaqueous solution. Subsequently, the substrate is washed with water at 50° C. to degrease, washed with water at 25° C., further washed with sulphuric acid, and an electrol copper plating film 56 with a thickness of 15 μm is formed on the area in which the plated resist 54 is not formed by performing electrolytic plating under the conditions noted below (FIG. 4(C)).

Solution for electrolytic plating is:

| Sulphuric acid | 2.24 mol/l, |
|---|---|
| Copper sulfate | 0.26 mol/l, and |
| Additive | 19.5 ml/l (e.g., manufactured by Atotech Japan, Cupracid GL). |

The conditions for electrolytic plating are:

| Current density | 1 A/dm2, |
|---|---|
| Time | 70 minutes, and |
| Temperature | 22 ± 2° C. |

Figure 4D:
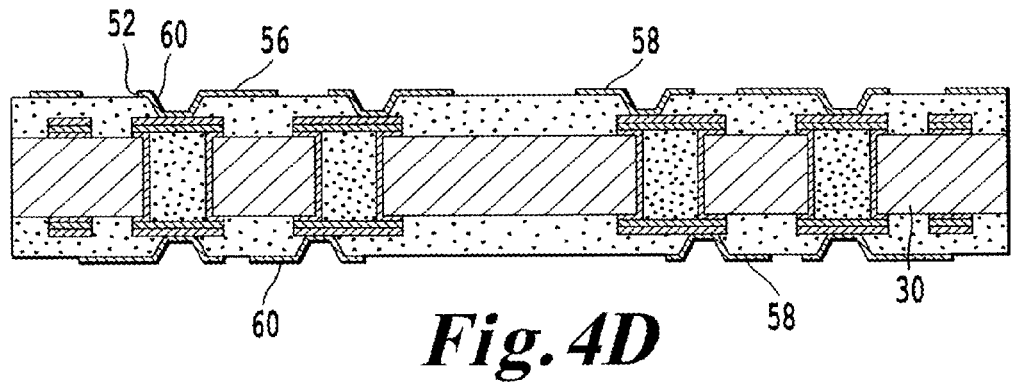

(15) Furthermore, after delaminating to remove the plated resist 54 with 5% KOH, the nonelectrolytic plating film under the plated resist is dissolved to remove by etching with a mixture of sulphuric acid and hydrogen peroxide to make an independent conductor circuit 58 and a via-hole 60 (FIG. 4(D)).

(16) Subsequently, by performing a similar treatment as the abovementioned (4), on the surface of the conductor circuit 58 and the via-hole 60, a rough surface 58a is formed. The thickness of the lower layer conductor circuit 58 is 15 μm (FIG. 5(A)). However, the thickness of the lower layer conductor circuit may be formed between 5 to 25 μm.

Figure 5A:
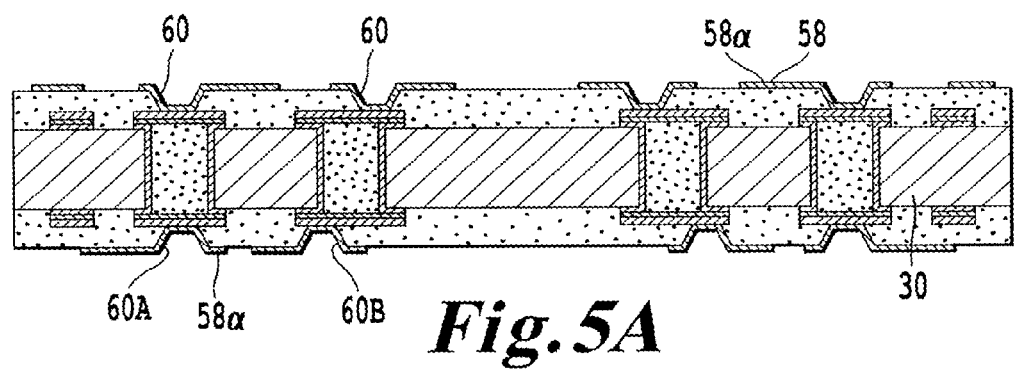
FIG. 5 is a flowchart showing a method for manufacturing a multilayered printed wiring board as in Embodiment 1.
Figure 5B:
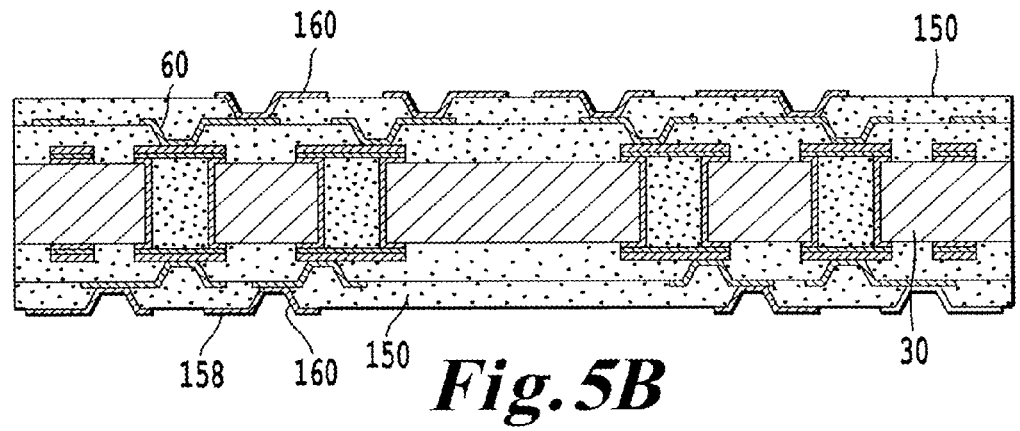
Figure 5C:
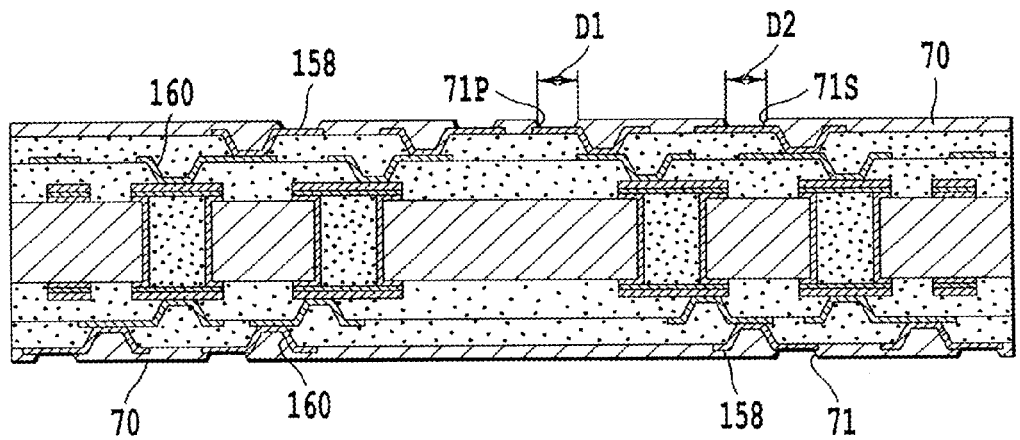
Figure 5D:
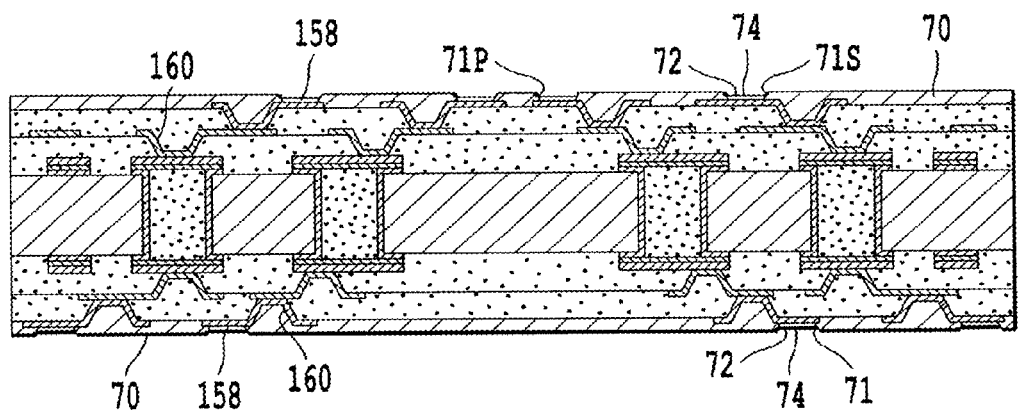

(17) By repeating the abovementioned processes from (9) to (16), a further interlayer insulating layer 150 having an upper layer conductor circuit 158 and a via-hole 160 is formed and a multilayered wiring board is obtained (FIG. 5(B)).

(18) Next, after a commercially available solder resist composition 70 is applied with a thickness of 20 μm on both sides of the multilayered wiring substrate and dried under 70° C. for 20 minutes and at 70° C. for 30 minutes, a photomask with a thickness of 5 mm on which the pattern of the solder resist aperture area is drawn is closely attached to the solder layer 70, exposed to ultraviolet rays at 1,000 mJ/cm$^2$, and treated to develop in the DMTG solution. A large-diameter (D1=105 μm) aperture 71P and a small-diameter (D2=80 μm) aperture 71S are formed on the upper surface, and an aperture 71 with diameter of 200 μm is formed on the lower surface (FIG. 5(C)). Then, the substrate is further heated under 80° C. for one hour, at 100° C. for one hour, at 120° C. for one hour, and at 150° C. for 3 hours to harden the solder resist layer, and a solder resist pattern layer with a thickness between 15 to 25 μm having an aperture is formed.

(19) Next, the substrate on which the solder resist layer 70 is formed is soaked into electroless nickel solution at pH=4.5 containing nickel chloride (2.3×10$^{-1}$ mol/l), sodium hypophosphite (2.8×10$^{-1}$ mol/l), and sodium citrate (1.6×10$^{-1}$ mol/l) for 20 minutes, and a nickel-plated layer 72 with a thickness of 5 μm is formed on aperture areas 71, 71S, and 71P. Furthermore, the substrate is soaked into electroless gold-plating solution containing gold potassium cyanide (7.6×10$^{-3}$ mol/1), ammonium chloride (1.9×10$^{-1}$ mol/l), sodium citrate (1.2×10$^{-1}$ mol/l), and sodium hypophosphite (1.7×10$^{-1}$ mol/l) at 80° C. for 7.5 minutes, and a gold-plated layer 74 with a thickness of 0.03 μm is formed on the nickel-plated layer 72 (FIG. 5(D)). Other than the nickel-gold layer, a single layer of tin or noble metal layers (gold, silver, palladium, platinum, etc.) may be formed.

(20) A process to mount a solder ball:

Continuously, with reference to FIG. 6 to FIG. 8, a process to mount a solder ball on the multilayered printed wiring board 10 with the device for mounting a solder ball 100 mentioned above with reference to FIG. 13 is explained.

Figure 6A:
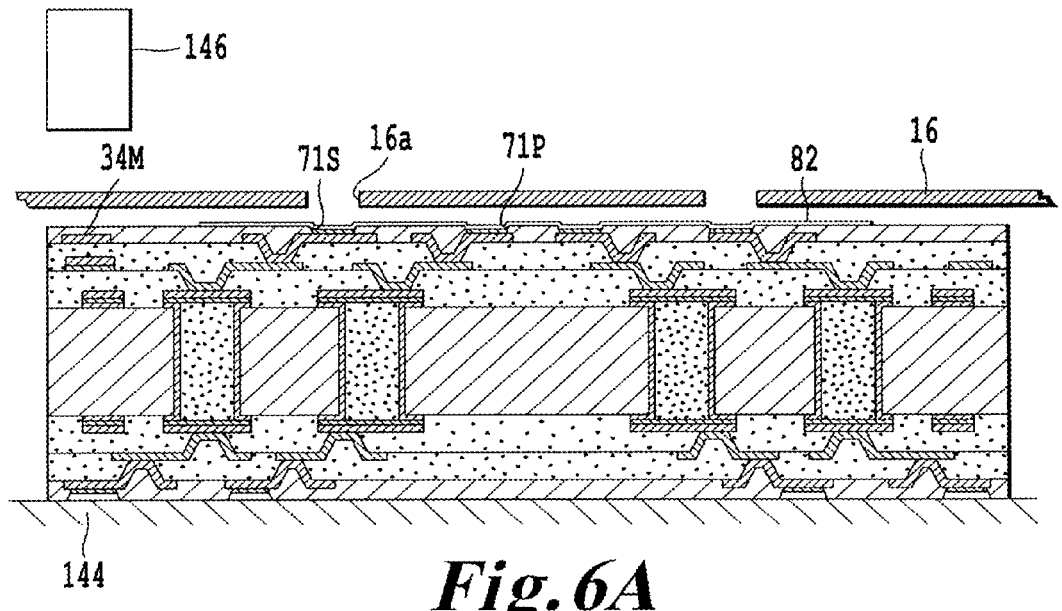
FIG. 6 is a flowchart showing a method for manufacturing a multilayered printed wiring board as in Embodiment 1.

(1) Recognition and correction of position for a multilayered printed wiring board:

As shown in FIG. 6(A), an alignment mark 34M for the multilayered printed wiring board 10 is recognized with an alignment camera 146 and the position of the multilayered printed wiring board 10 is corrected with an XYθ suction table 114 against a small-diameter mask for aligning a ball 16. In other words, each aperture 16a of the small-diameter mask for aligning a ball 16 is positioned so as to correspond to the small-diameter aperture 71S of the multilayered printed wiring board 10.

Figure 6B:
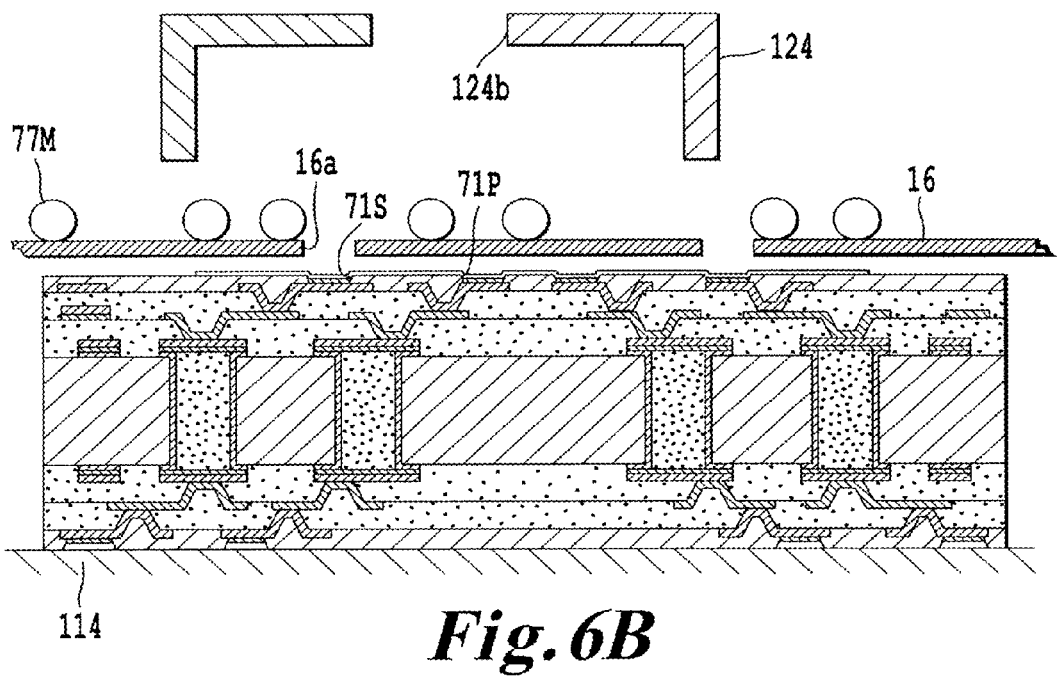

(II) Feeding of solder balls:

As shown in FIG. 6(B), solder balls 77M (diameter 75 μm, Sn63Pb37 (e.g., manufactured by Hitachi Metals, Ltd.)) are fed with the specified quantity to the mount cylinder 124 from a feeding device for solder balls 122. In addition, it may be pre-fed in the mount cylinder. Although Sn/Pb solder is used for solder balls in the example embodiments, it may be a Pb-free solder with Sn and any optionally selected from Ag, Cu, In, Bi, or Zn, etc.

Figure 7A:
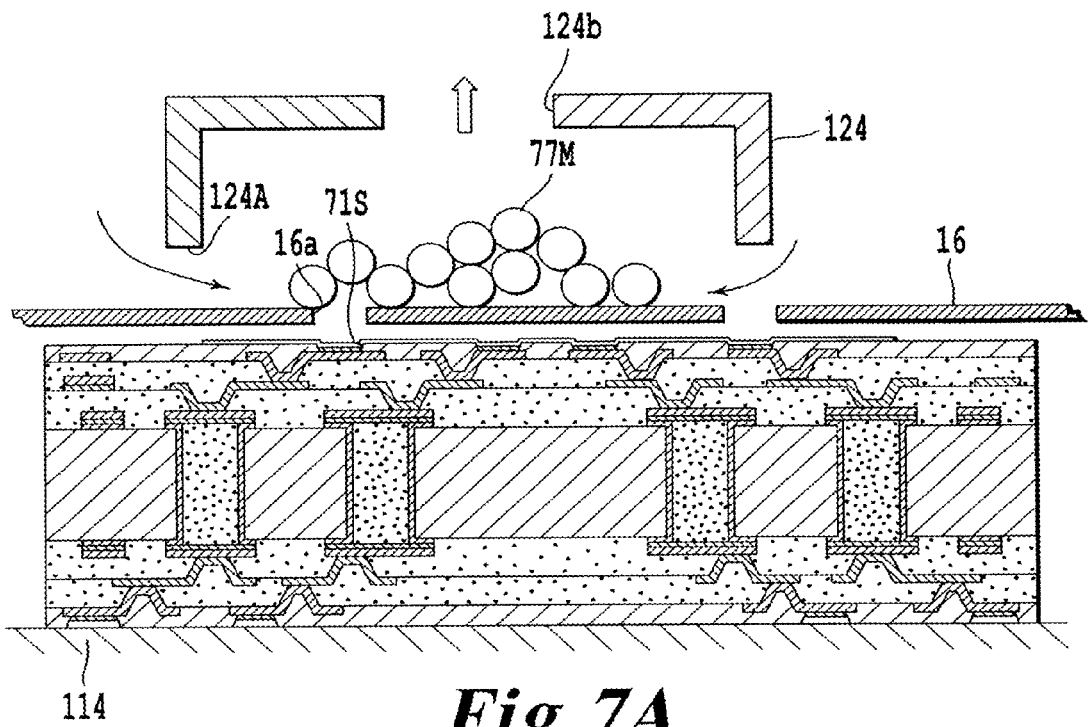
FIG. 7 is a flowchart showing a method for manufacturing a multilayered printed wiring board as in Embodiment 1.

(III) Mounting of solder balls:

As shown in FIG. 7(A), by positioning the mount cylinder 124 on the upper part of the small-diameter mask for aligning a ball 16 while holding the prescribed clearance (i.e., 0.5 to 4 times the diameter of a solder ball) with said mask for aligning the ball and intaking air from the suction area 24b, the flow rate in the gap between the mount cylinder and the printed wiring board is made between 5 m/sec to 35 m/sec, and solder balls 77M are aggregated on the small-diameter mask for aligning the ball 16 immediately below the aperture area 124A of said mount cylinder 124.

Figure 7B:
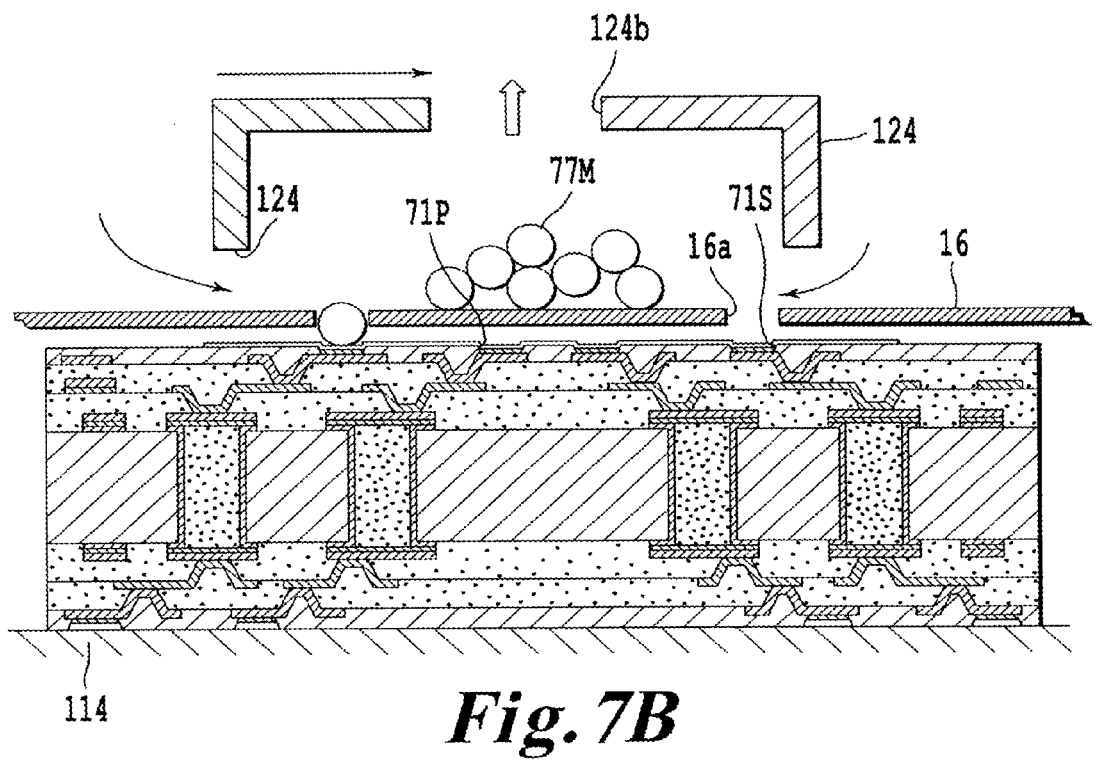

Subsequently, as shown in FIG. 7(B) and FIG. 8(A), the mount cylinder 124 aligned along the axis of the multilayered printed wiring board 10 in FIG. 13(B) and FIG. 13(A) is sent horizontally along to the X-axis through a moving axis in an X direction 140. In such manner, solder balls 77M aggregated on the small-diameter mask for aligning a ball 16 are moved as the mount cylinder 124 moves, and the solder balls 77M are dropped into the small-diameter aperture 71S of the multilayered printed wiring board 10 through the aperture 16a of the small-diameter mask for aligning the ball 16 to mount. In such manner, the solder balls 77M are aligned sequentially on all the joint pads of the multilayered printed wiring board 10.

(IV) Removal of absorbed solder balls:

As shown in FIG. 8(B), after the redundant solder balls 77M are guided to a position where there is no aperture 16a on the small-diameter mask for aligning the ball 16 with the mount cylinder 124, it is sucked and removed by the cylinder for removing absorbed balls 161.

Next, in order to mount large-diameter (90 μm) solder balls in a large-diameter aperture 71P of a solder resist layer 70, a large-diameter mask for aligning a ball 17 is positioned against the multilayered printed wiring board 10 (FIG. 9). At this time, on the large-diameter mask for aligning the ball 17, an aperture 17b for mounting corresponding to a large-diameter aperture 71P and an aperture 17a, for avoiding or minimizing contact, corresponding to a small-diameter aperture 71S are equipped. This aperture 17a for avoiding can avoid interfering with the solder ball 77M on the small-diameter aperture 71S while positioning the large-diameter mask for aligning the ball 17 proximally to the solder resist layer 70.

Through the aperture 17*b* for mounting the large-diameter mask for aligning the ball 17, the large-diameter solder balls 77L are mounted in the large-diameter apertures 71P. At this time, although the abovementioned device for mounting a solder ball 100 is included with reference to FIG. 13, an existing squeegee may be used.

(21) After that, by reflowing at 23° C., solder ball 77M and solder ball 77L are melted and solder bump 78P and 78S are formed. Subsequently, a solder bump 78D is also formed on the backside to make a multilayered printed wiring board (FIG. 10).

By placing an IC chip 90 on the multilayered printed wiring board 10 and reflowing, a joint pad of the printed wiring board and an electrode of the IC chip 90 are jointed through the solder bump 78P and 78S. Then, it is mounted on a daughter board 94 through the solder bump 78D (FIG. 11).

In Embodiment 1, where a small-diameter bump 78S is formed from the small-diameter solder ball 77M mounted in the small-diameter aperture 71S of the solder-resist layer 70 and a large-diameter bump 78P is formed from the large-diameter solder ball 77L mounted in the large-diameter aperture 71P, the small-diameter bump 78S and the large-diameter bump 78P with different diameters can be formed at approximately same height. Consequently, when mounting the IC chip 90 through the small-diameter bump 78S and the large-diameter bump 78P, it is possible to improve the mounting yield of the IC chip 90. Also, it is possible to secure joint reliability between the IC chip 90 and the multilayered printed wiring board 10.

Additionally, according this Embodiment, the mount cylinder 124 is positioned on the upper side of the small-diameter mask for aligning a ball 16, solder balls 77M are aggregated by intaking air from said mount cylinder 124, the aggregated solder balls 77M are moved on the small-diameter mask for aligning the ball 16 by moving the mount cylinder 124 horizontally, and the solder balls 77M are dropped into the small-diameter aperture 71S of the multilayered printed wiring board 10 through the aperture 16*a* of the small-diameter mask for aligning the ball 16. Consequently, the fine solder balls 77M can be securely mounted in all or essentially all of the small-diameter aperture 71S of the multilayered printed wiring board 10. Additionally, because the solder balls 77M are moved without contacting (or minimum contact), unlike in cases involving the use of a squeegee, mounting in the small-diameter aperture 71S can be done with minimum damaging of the solder balls, and the height of the solder bump 78S can be made uniform. Furthermore, because the solder balls are guided by a sucking force, it can prevent the solder balls from aggregating and adsorbing.

[EMBODIMENT 2]

With reference to FIG. 12, a method for manufacturing a printed wiring board related to Embodiment 2 in the present invention is explained. In the abovementioned Embodiment 1, small-diameter solder balls 77M and large-diameter solder balls 77L are simultaneously reflowed. In the example of Embodiment 2, firstly small-diameter solder balls 77M are reflowed and then large-diameter solder balls 77L are mounted on the multilayered printed wiring board to reflow the large-diameter solder balls 77L.

Figure 12A:
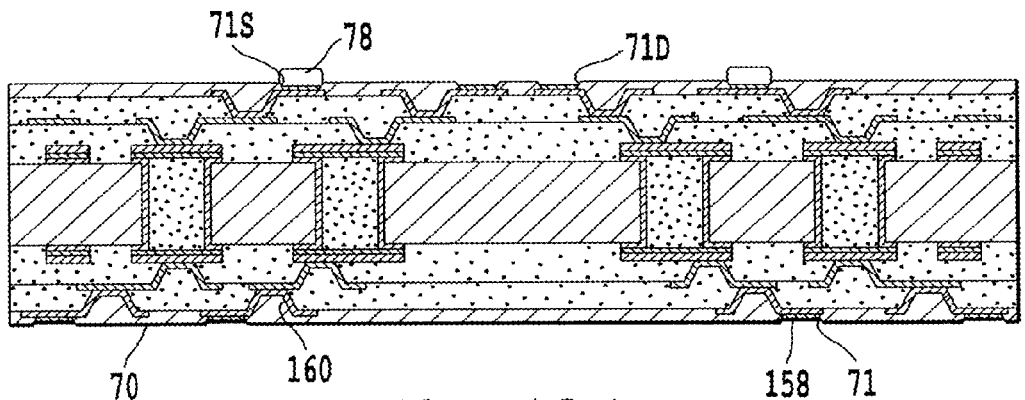
FIG. 12 is a flowchart showing a method for manufacturing a multilayered printed wiring board as in Embodiment 2.

With reference to FIG. 8(A), similar to the abovementioned Embodiment 1, after mounting small-diameter solder balls 77M in the small-diameter aperture 71S of the multilayered printed wiring board 10 to reflow at 200° C., small-diameter solder balls 77M are melted in the small-diameter aperture 71S and a solder body 78 is formed (FIG. 12(A)).

Figure 12B:
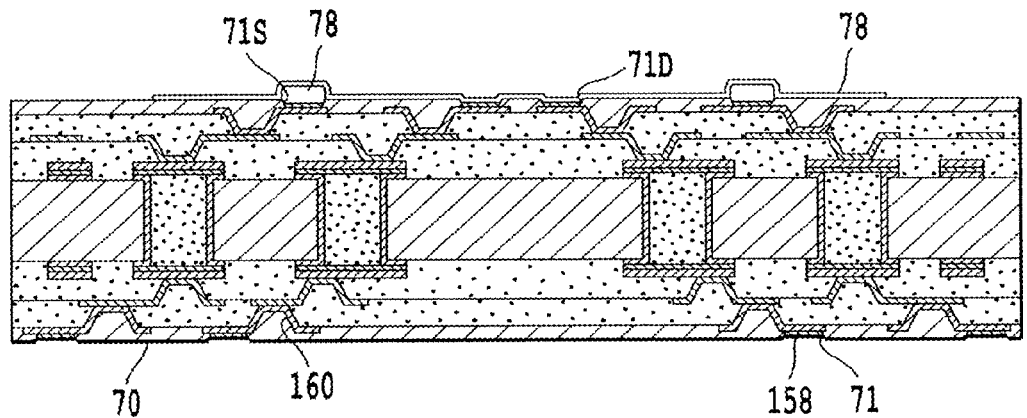

After washing to reflow, a flux 82 is applied on the solder resist layer 70 again (FIG. 12(B)).

Figure 12C:
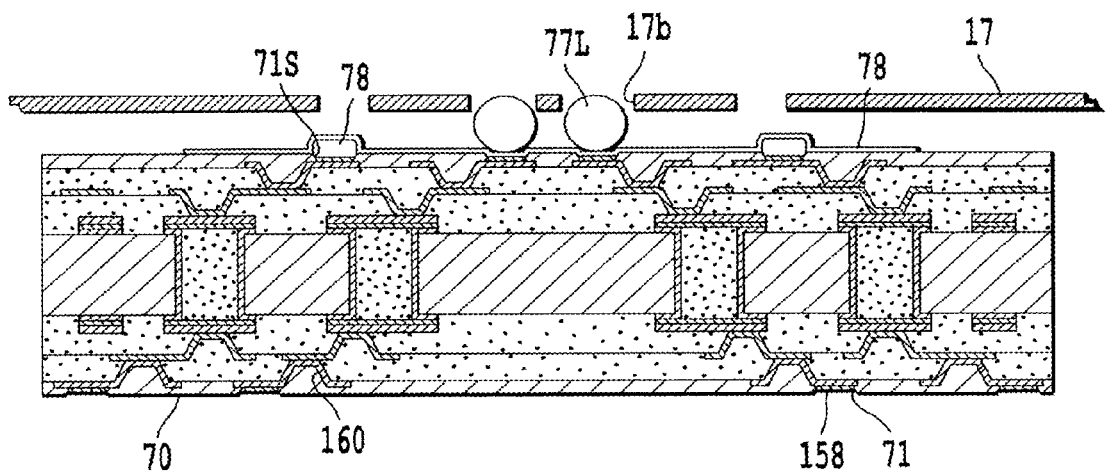

Using a mask 17 comprising an aperture 17*b* that corresponds to a large-diameter aperture 71P, large-diameter solder balls 77L are mounted in the large-diameter aperture 71P (FIG. 12(C)). Subsequently, by reflowing at 230° C., solder bumps 78P and 78S are formed from the solder body 78 in the small-diameter aperture 71S and the large-diameter solder ball 77L in the large-diameter aperture 71P (FIG. 10).

In Embodiment 2, after forming a solder body 78 from a small-diameter solder ball 77M by reflowing, a mask 17 for large diameter (or only a large diameter) is used. Because the solder body 78 does not misposition even if the mask 17 comes into contact, the mask 17 can be positioned proximally to the solder resist layer 70 and the large-diameter solder ball 77L can be appropriately mounted in the large-diameter aperture 71P, resulting in the prevention of mispositioning or missing the large-diameter bump 78P.

Aperture diameter on the solder resist layer and height of the solder bumps on the solder ball are now explained. FIG. 14(A) is a table showing the correspondence between the diameter of a solder ball and the height of a solder bump against an aperture diameter of 80 µm corresponding to the small-diameter aperture 71S, and FIG. 14(B) is a table showing the correspondence between the diameter of a solder ball and the height of a solder bump against an aperture diameter of 105 µm corresponding to the large-diameter aperture 71P. In the figure, $\Sigma$ represents the standard deviation of the height of the bump and N represents the number of measurements (N=15).

As shown in FIG. 14(A), in order to adjust the height of a solder bump to 30 µm against the small-diameter aperture 71S (aperture diameter 80 µm), it was realized that a solder ball 77M with diameter of approximately 75 µm should be used. On the other hand, as shown in FIG. 14(B), in order to adjust the height of a solder bump to 30 µm against the large-diameter aperture 71P (aperture diameter 105 µm), it was clear that a solder ball 77L with a diameter of approximately 88 to 90 µm should be used. Although a mount cylinder is moved when mounting a solder ball in the abovementioned Embodiment, a mask and a printed wiring board may be moved, or both may be moved relative to one another.

A method for manufacturing a printed wiring board has been proven to form bumps with different diameters at the same height. Because a small-diameter bump 78S is formed from small-diameter solder balls 77M mounted in a small-diameter aperture 71S of a solder layer 70, and a large-diameter bump 78P is formed from large-diameter solder balls 77L mounted in a large-diameter aperture 71P, small-diameter bumps 78S and large-diameter bumps 78P with different diameters can be formed at the same heights H1 and H2. Consequently, when mounting an IC chip 90 through the small-diameter bump 78S and the large-diameter bump 78P, it is possible to secure joint reliability between the IC chip 90 and the multilayered printed wiring board 10.

A method for manufacturing a printed wiring board has been proven to form bumps with different diameters at the same height. Because a small-diameter bump 78S is formed from small-diameter solder balls 77M mounted in a small-diameter aperture 71S of a solder layer 70, and a large-diameter bump 78P is formed from large-diameter solder balls 77L mounted in a large-diameter aperture 71P, small-diameter bumps 78S and large-diameter bumps 78P with different diameters can be formed at the same heights H1 and H2. Consequently, when mounting an IC chip 90 through the small-diameter bump 78S and the large-diameter bump 78P, it is possible to secure joint reliability between the IC chip 90 and the multilayered printed wiring board 10.

The invention claimed is:

1. A method for manufacturing a printed wiring board, the method comprising:

forming a solder resist layer having a small-diameter aperture and a large-diameter aperture, each aperture exposing a respective joint pad;

mounting a metal ball having a first diameter in said small-diameter aperture by using a mask for small diameter metal balls, which comprises a small-diameter aperture area that corresponds to the small-diameter aperture on the solder resist layer;

mounting a metal ball having a second diameter larger than the first diameter in said large-diameter aperture by using a mask for large diameter metal balls, which comprises a large-diameter aperture area that corresponds to the large-diameter aperture on the solder resist layer, wherein the mask for large diameter metal balls is a different mask from the mask for small diameter metal balls;

forming a small-diameter bump from the metal ball having a first diameter and a large-diameter bump from the metal ball having a second diameter by heating each of the metal ball with a first diameter and the metal ball with a second diameter to at least their respective reflow temperatures, and selecting a size for each of the small diameter aperture, the metal ball having a first diameter, the large diameter aperture, and the metal ball having a second diameter, these sizes being selected to provide the small-diameter bump and the large-diameter bump having a same height;

wherein said mounting a metal ball having a first diameter comprises:

providing at least one mount cylinder, the at least one mount cylinder having a suction area for removing air from an interior of the at least one mount cylinder, and an aperture area for intaking air into the interior of the at least one mount cylinder in response to said suction area removing air, aggregating a plurality of metal balls having the first diameter on the mask for small diameter metal balls by:

positioning said aperture area of the at least one mount cylinder above an upper side of the mask for small diameter metal balls, and sucking air through the suction area of said at least one mount cylinder such that the plurality of metal balls having the first diameter are aggregated under the at least one mount cylinder by intake air through the aperture, without removing any of the plurality of metal balls aggregated from the at least one mount cylinder through the suction area; and dropping the metal ball having a first diameter into the small-diameter aperture on the solder resist layer through the small-diameter aperture area of the mask for small diameter metal balls by moving the at least one mount cylinder along the mask for small diameter metal balls thereby moving plurality of metal balls aggregated on the mask.

2. The method of claim 1, wherein said mounting a metal ball having a second diameter larger than the first diameter comprises using the mask for large diameter metal balls, which further comprises a small-diameter aperture area that corresponds to the small-diameter aperture on the solder resist layer.

3. A method for manufacturing a printed wiring board, the method comprising:

forming a solder resist layer having a small-diameter aperture and a large-diameter aperture, each aperture exposing a respective joint pad;

mounting a metal ball having a first diameter in said small-diameter aperture by using a mask for small diameter metal balls, which comprises a small-diameter aperture area that corresponds to the small-diameter aperture on the solder resist layer;

forming a small-diameter bump by heating the metal ball having a first diameter to at least a reflow temperature for the metal ball having a first diameter;

after said forming a small diameter bump, mounting a metal ball having a second diameter larger than the first diameter in said large-diameter aperture by using a mask for large diameter metal balls, which comprises a large-diameter aperture area that corresponds to the large-diameter aperture on the solder resist layer, wherein the mask for large diameter metal balls is a different mask from the mask for small diameter metal balls;

forming a large-diameter bump by heating the metal ball having a second diameter to at least a reflow temperature for the metal ball having the second diameter; and selecting a size for each of the small diameter aperture, the metal ball having a first diameter, the large diameter aperture, and the metal ball having a second diameter, these sizes being selected to provide the small-diameter bump and the large-diameter bump having a same height, wherein said mounting a metal ball having a first diameter comprises:

providing at least one mount cylinder having a suction area for removing air from an interior of the at least one mount cylinder, and an aperture area for intaking air into the interior of the at least one mount cylinder in response to said suction area removing air, aggregating a plurality of metal balls having the first diameter on the mask for small diameter metal balls immediately below said at least one mount cylinder containing a supply of metal balls having the first diameter by positioning said aperture area of said at least one mount cylinder, which corresponds to said mask for small diameter metal balls, on an upper side of the mask for small diameter metal balls, and sucking air through said suction area of said at least one mount cylinder where the supply of metal balls having the first diameter is contained such that the plurality of metal balls having the first diameter are aggregated under said at least one mount cylinder without removing any of the plurality of metal balls aggregated from said at least one mount cylinder through said suction area; and dropping the metal ball having a first diameter into the small-diameter aperture on the solder resist layer through the small-diameter aperture area of the mask for small diameters by moving the metal balls having a small diameter that are aggregated on the mask for small diameter metal balls by moving said at least one mount cylinder containing a supply of metal balls having the first diameter horizontally such that the aggregated metal balls move along the mask without being pushed by physical contact with interior walls of said at least one mount cylinder.

4. The method of claim 1, wherein said mounting a metal ball having a second diameter comprises:

aggregating a plurality of metal balls having the second diameter on the mask for large diameter metal balls immediately below said at least one mount cylinder by positioning said aperture area of said at least one mount, which corresponds to said mask for large diameter metal balls, on an upper side of the mask for large diameter metal balls and sucking air with said at least one mount cylinder such that the plurality of metal balls having the second diameter are aggregated under said at least one mount cylinder; and dropping the metal ball having a second diameter into the large-diameter aperture on the solder resist layer through the large-diameter aperture area of the mask for large diameter metal balls by moving the metal balls having a second diameter that are aggregated on the mask for large diameter metal balls by moving said at least one mount cylinder horizontally.

5. The method of claim 3, wherein said mounting a metal ball having a second diameter comprises:

aggregating a plurality of metal balls having the second diameter on the mask for large diameter metal balls immediately below said at least one mount cylinder by positioning said aperture area of said at least one mount cylinder, which corresponds to said mask for large diameter metal balls, on an upper side of the mask for large diameter metal balls and sucking air with said at least one mount cylinder such that the plurality of metal balls having the second diameter are aggregated under said at least one mount cylinder; and dropping the metal ball having a second diameter into the large-diameter aperture on the solder resist layer through the large-diameter aperture area of the mask for large diameter metal balls by moving the metal balls having a second diameter that are aggregated on the mask for large diameter metal balls by moving said at least one mount cylinder horizontally.

6. The method of claim 3, wherein said mounting a metal ball having a second diameter larger than the first diameter comprises using the mask for large diameter metal balls, which further comprises a small-diameter aperture area that corresponds to the small-diameter aperture on the solder resist layer.

7. The method of claim 1, wherein said dropping comprises moving the said at least one mount cylinder horizontally such that the aggregated metal balls move along the mask without being pushed by physical contact with interior walls of said at least one mount cylinder.

8. The method of claim 1, further comprising:

providing a removal cylinder separate from said at least one mount cylinder and having another suction area and another aperture area; and removing redundant solder balls by sucking air through the another suction area of said removal cylinder such that the metal balls which are not dropped onto any aperture of the solder resist layer are moved under the removal cylinder and removed from the removal cylinder through the another suction area.

9. The method of claim 3, further comprising:

providing a removal cylinder separate from said at least one mount cylinder and having another suction area and another aperture area; and removing redundant solder balls by sucking air through the another suction area of said removal cylinder such that the metal balls which are not dropped onto any aperture of the solder resist layer are moved under the removal cylinder and removed from the removal cylinder through the another suction area.

\* \* \* \* \*